United States Patent
Fitz et al.

(10) Patent No.: US 8,835,318 B2
(45) Date of Patent: Sep. 16, 2014

(54) $HNO_3$ SINGLE WAFER CLEAN PROCESS TO STRIP NICKEL AND FOR MOL POST ETCH

(75) Inventors: Clemens Fitz, Dresden (DE); Jochen Poth, Dresden (DE); Kristin Schupke, Dresden (DE)

(73) Assignee: GlobalFoundries Inc., Grand Cayman (KY)

( * ) Notice: Subject to any disclaimer, the term of this patent is extended or adjusted under 35 U.S.C. 154(b) by 133 days.

(21) Appl. No.: 13/414,946

(22) Filed: Mar. 8, 2012

(65) Prior Publication Data
US 2013/0234335 A1 Sep. 12, 2013

(51) Int. Cl.
*H01L 21/283* (2006.01)
*H01L 23/532* (2006.01)

(52) U.S. Cl.
USPC ........... 438/686; 438/586; 438/595; 438/660; 438/682; 257/E21.159

(58) Field of Classification Search
USPC ........................................................ 438/686
See application file for complete search history.

(56) References Cited

U.S. PATENT DOCUMENTS

| | | | |
|---|---|---|---|
| 2003/0190812 A1* | 10/2003 | Padhi et al. | 438/694 |
| 2004/0127053 A1* | 7/2004 | Wofford et al. | 438/704 |
| 2007/0254479 A1* | 11/2007 | Fang et al. | 438/682 |
| 2009/0004851 A1* | 1/2009 | Shue et al. | 438/660 |
| 2010/0144146 A1* | 6/2010 | Utaka et al. | 438/682 |
| 2010/0178764 A1* | 7/2010 | Narita et al. | 438/664 |
| 2011/0169096 A1* | 7/2011 | Chen et al. | 257/369 |

* cited by examiner

*Primary Examiner* — Angel Roman
(74) *Attorney, Agent, or Firm* — Ditthavong & Steiner, P.C.

(57) ABSTRACT

Ni and Pt residuals are eliminated by replacing an SPM cleaning process with application of $HNO_3$ in an SWC tool. Embodiments include depositing a layer of Ni/Pt on a semiconductor substrate, annealing the deposited Ni/Pt layer, removing unreacted Ni from the annealed Ni/Pt layer by applying $HNO_3$ to the annealed Ni/Pt layer in an SWC tool, annealing the Ni removed Ni/Pt layer, and removing unreacted Pt from the annealed Ni removed Ni/Pt layer. Embodiments include forming first and second gate electrodes on a substrate, spacers on opposite sides of each gate electrode, and Pt-containing NiSi on the substrate adjacent each spacer, etching back the spacers, forming a tensile strain layer over the first gate electrode, applying a first $HNO_3$ in an SWC tool, forming a compressive strain layer over the second gate electrode, and applying a second $HNO_3$ in an SWC tool.

12 Claims, 6 Drawing Sheets

HNO₃ SINGLE WAFER CLEAN PROCESS TO STRIP NICKEL AND FOR MOL POST ETCH

TECHNICAL FIELD

The present disclosure relates to semiconductor silicidation with reduced platinum (Pt) residues. The present disclosure is particularly applicable to 32 nanometer (nm) technology nodes and beyond with nickel silicide (NiSi) and a titanium nitride (TiN) high-K metal gate.

BACKGROUND

NiSi is employed as a low conductive electrode material in modern semiconductor devices. To form a self-aligned silicide, Ni/Pt is sputtered on the wafer by physical vapor deposition (PVD), and a rapid thermal anneal (RTA) is performed to form rich NiSi phases. Subsequently, excess and unreacted Ni/Pt is stripped with strong acid mixtures such as piranha (a mixture of sulfuric acid and hydrogen peroxide (SPM)) or nitric acid (HNO₃) in a sink bath process, followed by a second RTA process to transform the metal rich phases into a low conductive Ni mono silicide. Since unreacted Pt remains after the second RTA, concentrated Aqua Regia (1:4) (HNO₃ plus hydrochloric acid (4HCl)) or a hot SPM, for example at temperatures greater than 160° C., is employed to remove the Pt residuals.

The two strip processes must remove the Ni/Pt effectively with a minimal effect on underlying layers. For example, when performing the Ni/Pt strip processes, the etch rate must be small for silicon nitride (Si₃N₄) spacers, a silicon dioxide (SiO₂) field oxide, a TiN high-k metal gate, nickel platinum silicide (NiPtSi) contact electrodes, and nickel platinum silicide germanium (NiPtSiGe) source/drain contact electrodes for strain applications. Although hot SPM is very efficient in removing the Ni and Pt, it also results in a high etch rate for TiN. Weaknesses in the encapsulation can open a path for the SPM to remove the TiN. Therefore, hot SPM is not suitable for a gate first integration scheme.

Aqua Regia works more efficiently for the Pt strip after HNO₃ is employed for the Ni strip. When Aqua Regia is applied, the HCl yields chloride ions which react with Pt according to formula 1 to form chloroplatinate ion (PtCl6), which in turn is soluble and forms chloroplatinous acid (H2PtCl4).

$$Pt^{4+}(aq)+6Cl^-(aq) \rightarrow PtCl_6^{2-}(aq) \quad \quad \text{Formula 1}$$

Accordingly, the Aqua Regia Pt strip process is only effective if the Pt is not bound and can freely react to form the chloroplatinate. If the Pt has formed an oxygenic complex (Pt—O), the reaction with Aqua Regia will not occur, and Pt will remain on the wafer. Neither SPM with a temperature less than 130° C. nor HNO₃ in a SNK process for removing unreacted Ni keeps the unreacted Pt in chemical solution, and, therefore, a subsequent application of Aqua Regia will result in Pt residues, which can result in contact-to-gate shorts.

In addition, during middle-of-line (MOL) processes, the spacers are etched back (by spacer proximity technology etch (SPT-ET)) to open a place for tensile plasma enhanced nitride (TPEN) and compressive plasma enhanced nitride (CPEN) strain layers, which are deposited and etched back separately. During SPT-ET, Ni/Pt particles become redistributed and must be removed. Since the distance to the TiN high-k metal gate is short, aggressive etch chemistries can attack the underlying TiN. Therefore, SPM cannot be used for MOL etch passcleans.

Attempts to solve the MOL etch passclean problem have included using a cold SPM, such as at temperatures less than or equal to 90° C., in combination with a standard clean solution #1 (SC-1) spray process (e.g., using a mixture of ammonium hydroxide (NH₄OH), hydrogen peroxide (H₂O₂), and diluted (DI) water). However, underlying TiN may still be attacked.

A need therefore exists for methodology enabling improved removal of Ni/Pt residuals, with low TiN etch rate, and the resulting structure.

SUMMARY

An aspect of the present disclosure is a method including removing Ni residuals by applying HNO₃ in a single wafer (SWC) tool.

Another aspect of the present disclosure is a device formed by removing Ni residuals by applying HNO₃ in an SWC tool.

A further aspect of the present disclosure is a method including applying a HNO₃ in an SWC tool after formation of each strain layer.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: depositing a layer of Ni/Pt on a semiconductor substrate; annealing the deposited Ni/Pt layer; removing unreacted Ni from the annealed Ni/Pt layer by applying HNO₃ to the annealed Ni/Pt layer in an SWC tool; annealing the Ni removed Ni/Pt layer; and removing unreacted Pt from the annealed Ni removed Ni/Pt layer.

Aspects of the present disclosure include performing an SC1 spray process subsequent to applying HNO₃ to the annealed Ni/Pt layer and prior to annealing the Ni removed Ni/Pt layer. Further aspects include applying HNO₃ to the annealed Ni/Pt layer at a volume ratio of HNO₃ to water of 1:1 or 1:20. Another aspect includes applying HNO₃ to the annealed Ni/Pt layer at a temperature of 40° C. to 60° C. An additional aspect includes applying HNO₃ to the annealed Ni/Pt layer for 30 seconds to 2 minutes. Other aspects include removing unreacted Pt by applying Aqua Regia. Further aspects include rinsing the Pt removed Ni/Pt layer with water at a temperature of 25° C. to 60° C. for 5 to 10 minutes. Another aspect includes precleaning the substrate with an ammonia and peroxide mixture (APM) or with diluted hydrofluoric acid (dHF). Additional aspects include annealing the Ni/Pt layer by performing a first rapid thermal anneal (RTA), for example at 240° C. to 350° C., and annealing the Ni removed Ni/Pt layer by performing a second RTA, for example at 400° C. to 480° C.

Another aspect of the present disclosure is a device including: a semiconductor substrate; gate electrodes on the semiconductor substrate; spacers on each side of each gate electrode; and Pt-containing NiSi on the substrate adjacent each spacer, wherein the Pt-containing NiSi is formed by: depositing a layer of nickel Ni/Pt on the semiconductor substrate, performing a first RTA on the deposited Ni/Pt layer, removing unreacted Ni from the annealed Ni/Pt layer by applying HNO₃ to the annealed Ni/Pt layer in an SWC tool, performing a second RTA on the Ni removed Ni/Pt layer, and removing unreacted Pt from the annealed Ni stripped Ni/Pt layer.

Aspects include the $HNO_3$ being applied to the annealed Ni/Pt layer at a volume ratio of $HNO_3$ to water of 1:1 or 1:20. Further aspects include the $HNO_3$ being applied to the annealed Ni/Pt layer at a temperature of 40° C. to 60° C. Another aspect includes the $HNO_3$ being applied to the annealed Ni/Pt layer for 30 seconds to 2 minutes. Additional aspects include unreacted Pt being removed by applying Aqua Regia. Other aspects include the Pt removed Ni/Pt layer being rinsed with water at a temperature of 25° C. to 60° C. for 5 to 10 minutes.

Another aspect of the present disclosure is a method including: forming first and second gate electrodes on a substrate, spacers on opposite sides of each gate electrode, and Pt-containing NiSi on the substrate adjacent each spacer; etching back the spacers; forming a tensile strain layer over the first gate electrode; applying a first $HNO_3$ in an SWC tool; forming a compressive strain layer over the second gate electrode; and applying a second $HNO_3$ or Aqua Regia in an SWC tool.

Aspects include applying a third $HNO_3$ or Aqua Regia in an SWC tool subsequent to etching back the spacers, but prior to forming the tensile strain layer. Further aspects include applying both the first $HNO_3$ and also the second $HNO_3$ or the Aqua Regia at a temperature of 25° C. to 60° C., for 30 seconds to 300 seconds. Other aspects include applying the first and second $HNO_3$ at a volume ratio of $HNO_3$ to water of 1:1 or 1:20. Another aspect includes applying the first $HNO_3$ at a volume ratio of $HNO_3$ to water of 1:1 or 1:20 and the Aqua Regia at a volume ratio of $HNO_3$ to HCL to water of 1:4:0 to 1:4:10 or 1:2:0 to 1:2:10.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of platinum residuals attendant upon forming NiPtSi and also Ni/Pt residuals that become redistributed during MOL SPT-ET processes. In accordance with embodiments of the present disclosure, unreacted Ni is removed during NiSi formation and redistributed Ni/Pt is removed during strain layer formation by applying $HNO_3$ in an SWC tool. By replacing SPM with $HNO_3$ in an SWC tool, underlying layers such as a TiN layer are not undesirably etched, yet the Pt and Ni residuals are efficiently removed.

Methodology in accordance with embodiments of the present disclosure includes depositing a layer of Ni/Pt on a semiconductor substrate, annealing the deposited Ni/Pt layer, removing unreacted Ni from the annealed Ni/Pt layer by applying $HNO_3$ to the annealed Ni/Pt layer in an SWC tool, annealing the Ni removed Ni/Pt layer, and removing unreacted Pt from the annealed Ni removed Ni/Pt layer.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
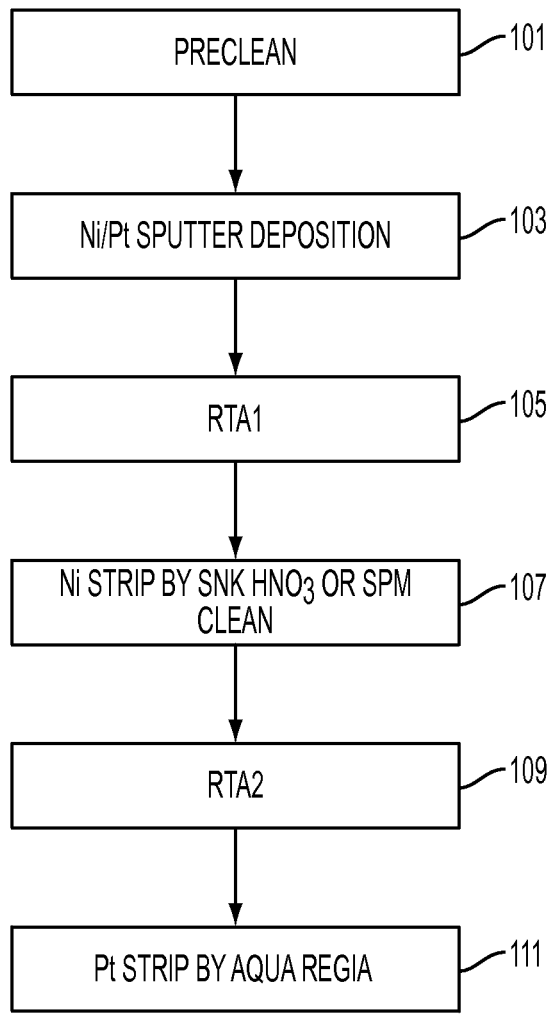
FIG. 1 schematically illustrates current process flow for forming NiPtSi in a semiconductor device.
Figure 2:
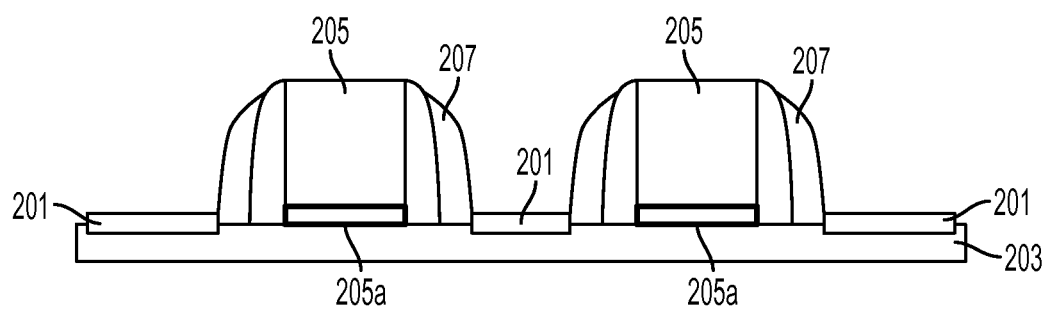
FIG. 2 schematically illustrates a semiconductor device including NiPtSi subsequent to stripping Ni an Pt residuals.

FIG. 1 illustrates a conventional process flow for forming NiPtSi 201 in a semiconductor device such as that illustrated in FIG. 2, particularly for 32 nm technologies and beyond. After gates 205 (including TiN metal layer 205a) and spacers 207 are formed, substrate 203 is precleaned, for example with dilute hydrofluoric acid (dHF) or with a mixture of ammonia and peroxide (APM), as shown at step 101. As illustrated at step 103, Ni with 10% Pt is sputter deposited over the entire substrate 203, gates 205, and spacers 207, and a first RTA, at temperatures greater than 260° C., is performed (step 105). Adverting to step 107, unreacted Ni (Ni that is not on Si) is stripped by an SPM clean process, e.g., either a sink bath (SNK) of 5:1 SPM at a temperature of 120° C. for 600 seconds or an SWC based SPM process. Then, a second RTA is performed, as shown at step 109. In step 111, unreacted Pt is stripped by applying Aqua Regia. Spacers 207 may then be etched back and shaped via SPT-ET, and strain layers may be formed.

Figure 3:
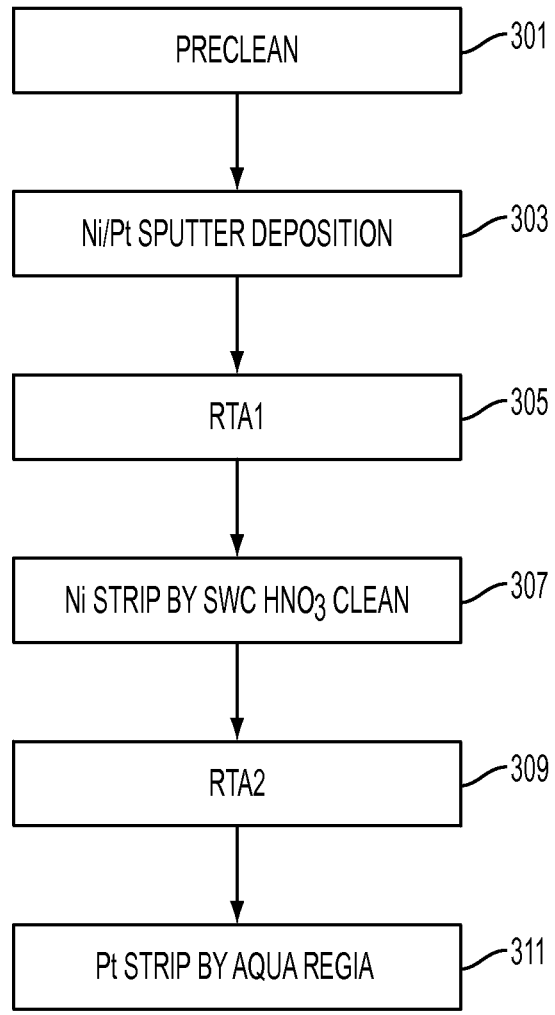
FIG. 3 illustrates a process flow for forming NiPtSi in a semiconductor device, in accordance with an exemplary embodiment.

Illustrated in FIG. 3 is a process flow for forming NiSi 201 in a semiconductor device such as that shown in FIG. 2, in accordance with embodiments of the present disclosure. The initial process flow is similar to that of the process flow illustrated in FIG. 1. Adverting to step 301, substrate 203 is precleaned by applying dHF or APM. Then, Ni with 10% Pt is sputter deposited over the entire substrate 203, such as by physical vapor deposition (PVD), in step 303. A first RTA is subsequently performed at 240° C. to 350° C. (step 305).

Adverting to step 307, unreacted Ni is stripped by applying $HNO_3$, at a volume ratio of $HNO_3$ to water of 1:1 or 1:20, in an SWC tool. The $HNO_3$ may be applied for 30 seconds to 2 minutes, at a temperature of 40° C. to 60° C., followed by an SC1 spray process to remove the particles from the wafer. In step 309, the Ni stripped Ni/Pt layer is annealed with a second RTA at a temperature higher than the first RTA, for example at 400° C. to 480° C.

Next, as shown by step 311, unreacted Pt is removed from the Ni/Pt layer by treating the layer with Aqua Regia at a dilution of 1:4 (HNO$_3$ to HCL) or with dilute Aqua Regia, at a volume ratio of HNO$_3$ to HCl to water of 1:5:4 or 1:2:2. The treated layer is then rinsed in water in a SNK bath, for example at 20° C. to 60° C. for 5 to 10 minutes. After the water rinse, all Ni and Pt residues are removed.

Figure 4:
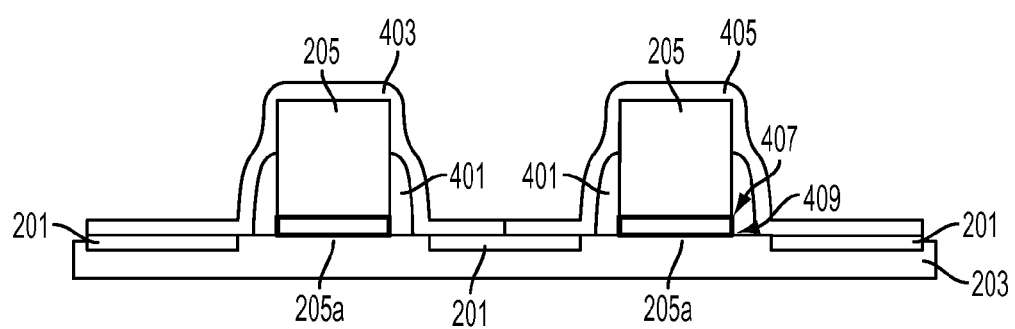
FIG. 4 illustrates the semiconductor device of FIG. 2 with strain layers post MOL SPT-ET processing.
Figure 5:
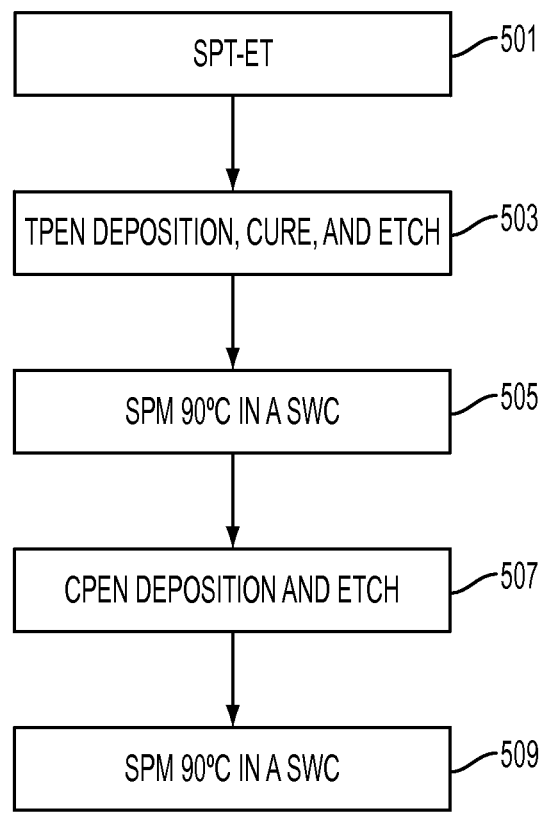
FIG. 5 illustrates an MOL process flow for forming the strain layers in the device of FIG. 4.

FIG. 4 illustrates the semiconductor device of FIG. 2 after strain layers are formed post SPT-ET processing. FIG. 5 illustrates an MOL process flow for forming the strain layers. Adverting to FIGS. 4 and 5, at step 501 spacers 207 are pulled back by SPT etching, resulting in spacers 401. Then, tensile plasma enhanced nitride is deposited, cured, and etched (step 503) to form TPEN strain layer 403, and SPM is applied at 90° C. in an SWC at step 505. Next, compressive plasma enhanced nitride is deposited and etched (step 507) to form CPEN strain layer 405, and SPM is again applied at 90° C. in an SWC at step 509. During SPT etching, small Pt residuals and Ni/Pt becomes redistributed, and must be removed. However, as illustrated in FIG. 4, encapsulation of TiN layer 205a is weakened, leading to possible TiN attacks via 407 or 409 during the SPM applications at steps 505 and 509.

Figure 6:
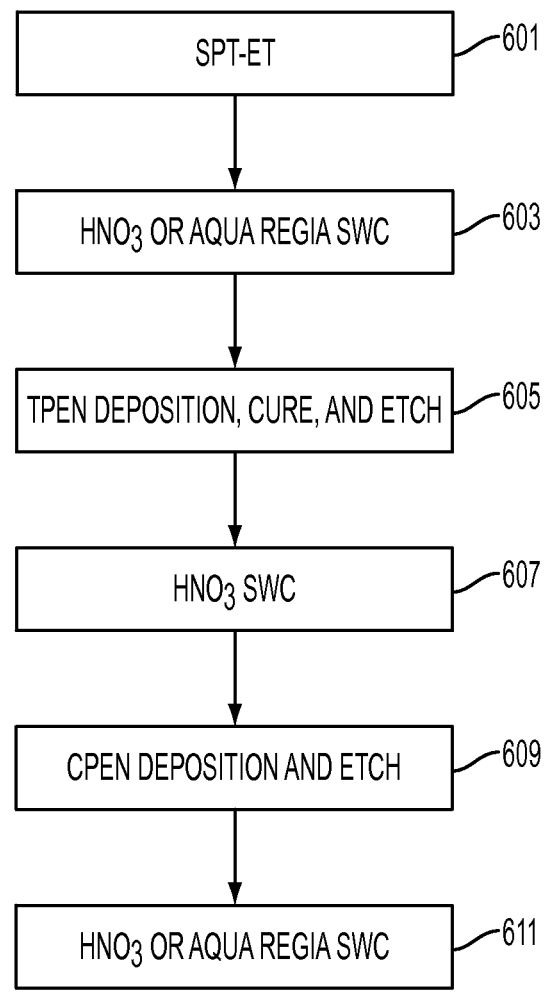
FIG. 6 illustrates an MOL process flow for forming the strain layers in the device of FIG. 4, in accordance with an exemplary embodiment.

FIG. 6 illustrates a process flow for forming strain layers, in accordance with an exemplary embodiment. Adverting to step 601, spacers 207 are pulled back by SPT etching similar to step 501. Unlike the conventional process flow, in which the SPT etching is not followed by a pass clean, in step 603, HNO$_3$, at a volume ratio of HNO$_3$ to water of 1:1 or 1:20, or Aqua Regia, at a volume ratio of HNO$_3$ to HCL to water of 1:4:0 to 1:4:10 or 1:2:0 to 1:2:10, is applied in an SWC tool. The HNO$_3$ or Aqua Regia may be applied at a temperature of 25° C. to 60° C., for 30 seconds to 300 seconds.

As illustrated at step 605, tensile plasma enhanced nitride is deposited, cured, and etched, similar to step 503, to form TPEN strain layer 403. However, instead of applying SPM as in step 505 in FIG. 5, HNO$_3$, at a volume ratio of HNO$_3$ to water of 1:1 or 1:20, is applied in an SWC tool at a temperature of 25° C. to 60° C., for 30 seconds to 300 seconds (step 607).

Adverting to step 609, compressive plasma enhanced nitride is deposited and etched, similar to step 507, to form CPEN strain layer 405. The SPM of step 509 in FIG. 5 is replaced with HNO$_3$, at a volume ratio of HNO$_3$ to water of 1:1 or 1:20, or Aqua Regia, at a volume ratio of HNO$_3$ to HCL to water of 1:4:0 to 1:4:10 or 1:2:0 to 1:2:10, applied in an SWC tool at a temperature of 25° C. to 60° C., for 30 seconds to 300 seconds (step 611). As a result of the HNO$_3$ or Aqua Regia cleaning processes in an SWC tool Ni/Pt residuals found post SPT-ET are efficiently removed without damaging the TiN layer of the gate electrode.

The embodiments of the present disclosure can achieve several technical effects, including efficient removal of Ni and Pt residuals during NiSi formation and during strain layer formation without damaging underlying layers, while maintaining high yield. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices that include a NiSi module, especially for 32 nm technologies and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   depositing a layer of nickel (Ni)/platinum (Pt) on a semiconductor substrate;
   annealing the deposited Ni/Pt layer;
   removing unreacted Ni from the annealed Ni/Pt layer by applying nitric acid (HNO3) to the annealed Ni/Pt layer in a single wafer clean (SWC) tool;
   annealing the Ni removed Ni/Pt layer;
   removing unreacted Pt from the annealed Ni removed Ni/Pt layer; and
   performing an SC1 spray process subsequent to applying HNO3 to the annealed Ni/Pt layer and prior to annealing the Ni removed Ni/Pt layer.

2. The method according to claim 1, comprising applying HNO3 to the annealed Ni/Pt layer at a volume ratio of HNO3 to water of 1:1 or 1:20.

3. The method according to claim 2, comprising applying HNO3 to the annealed Ni/Pt layer at a temperature of 40° C. to 60° C.

4. The method according to claim 3, comprising applying HNO3 to the annealed Ni/Pt layer for 30 seconds to 2 minutes.

5. The method according to claim 4, comprising removing unreacted Pt by applying Aqua Regia.

6. The method according to claim 5, further comprising rinsing the Pt removed Ni/Pt layer with water at a temperature of 25° C. to 60° C. for 5 to 10 minutes.

7. The method according to claim 4, further comprising precleaning the substrate with an ammonia and peroxide mixture (APM) or with diluted hydrofluoric acid (dHF).

8. The method according to claim 4, comprising annealing the Ni/Pt layer by performing a first rapid thermal anneal (RTA) at 240° C. to 350° C. and annealing the Ni removed Ni/Pt layer by performing a second RTA at 400° C. to 480° C.

9. A method comprising:
   forming first and second gate electrodes on a substrate, spacers on opposite sides of each gate electrode, and platinum (Pt)-containing nickel silicide (NiSi) on the substrate adjacent each spacer;
   etching back the spacers;
   forming a tensile strain layer over the first gate electrode;
   applying a first nitric acid (HNO3) in a single wafer clean (SWC) tool;
   forming a compressive strain layer over the second gate electrode;
   applying a second HNO3 or Aqua Regia in an SWC tool; and
   applying a third HNO3 or Aqua Regia in an SWC tool subsequent to etching back the spacers, but prior to forming the tensile strain layer.

10. The method according to claim 9, comprising applying both the first HNO3 and also the second HNO3 or the Aqua Regia at a temperature of 25° C. to 60° C., for 30 seconds to 300 seconds.

11. The method according to claim 9, comprising applying the first and second HNO3 at a volume ratio of HNO3 to water of 1:1 or 1:20.

12. The method according to claim 9, comprising applying the first HNO3 at a volume ratio of HNO3 to water of 1:1 or 1:20 and the Aqua Regia at a volume ratio of HNO3 to HCL to water of 1:4:0 to 1:4:10 or 1:2:0 to 1:2:10.

* * * * *